United States Patent
Shifren et al.

(10) Patent No.: US 8,377,807 B2
(45) Date of Patent: Feb. 19, 2013

(54) METHOD FOR MINIMIZING DEFECTS IN A SEMICONDUCTOR SUBSTRATE DUE TO ION IMPLANTATION

(75) Inventors: Lucian Shifren, San Jose, CA (US); Taiji Ema, Mie-ken (JP)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 12/895,657

(22) Filed: Sep. 30, 2010

(65) Prior Publication Data

US 2012/0083103 A1    Apr. 5, 2012

(51) Int. Cl.
*H01L 21/425* (2006.01)

(52) U.S. Cl. .................. 438/514; 438/519; 257/E21.328

(58) Field of Classification Search .................. None
See application file for complete search history.

(56) References Cited

U.S. PATENT DOCUMENTS

| | | | | |
|---|---|---|---|---|
| 4,617,066 | A  * | 10/1986 | Vasudev | 438/515 |
| 4,659,392 | A    | 4/1987  | Vasudev | |
| 6,841,439 | B1 * | 1/2005  | Anthony et al. | 438/216 |
| 2002/0016049 | A1 * | 2/2002 | Curello et al. | 438/514 |
| 2004/0032001 | A1 * | 2/2004 | Gilmer et al. | 257/500 |
| 2004/0038438 | A1 * | 2/2004 | Shih et al. | 438/30 |
| 2005/0277294 | A1 * | 12/2005 | Schaeffer et al. | 438/680 |
| 2006/0118887 | A1 * | 6/2006 | Lee | 257/384 |
| 2008/0069958 | A1 * | 3/2008 | Goh et al. | 427/307 |
| 2008/0090393 | A1 | 4/2008 | Aderhold | |
| 2009/0283842 | A1 * | 11/2009 | Hokazono | 257/392 |

OTHER PUBLICATIONS

PCT Notice of Transmittal of the International Search Report and the Written Opinion of the International Search Authority, or the Declaration, PCT/US2011/026585, 14 pp. dated May 31, 2011.

Jones, et al. "Shallow junction doping technologies for ULSI" Materials Science and Engineering R: Reports, Elsevier Sequoia S.A, Lausanne, CH, vol. 24, No. 1-2 pp. 1-80, dated Oct. 10, 1998.

Wang, et al., "Effects of forming cavities on the lattice quality and carrier profile in the B doped silicon" Materials Science and Engineering B, Elsevier Sequoia, Lausanne, CH, vol. 72, No. 2-3, pp. 142-145, dated Mar. 1, 2000.

Liang, et al. "Post-annealing sequence effects on the characteristics of 20keV BF2 ion implantation at various ion fluences", Nuclear Instruments & Methods in Physics Research, Section—B:Beam Interactions with Materials and Atoms, Elsevier, Amsterdam, NL, vol. 242, No. 1-2; pp. 605-609, Jan. 1, 2006.

Liang, et al., "Two-step post-annealing effects on the shallow-junction characteristics produced by BGe molecular ion implantation", Nuclear Instruments & Methods in Physics Research, Section—B:Beam Interactions with Materials and Atoms, Elsevier, Amsterdam, NL, vol. 249, No. 1-2 pp. 347-351, Aug. 1, 2006.

Liang, et al. "Post-annealing effects on the shallow-junction characteristics caused by high-fluence 77keV BSi molecular ion implantations at room and liquid nitrogen temperatures", Nuclear Instruments & Methods in Physics Research, Section—B:Beam Interactions with Materials and Atoms, Elsevier, Amsterdam, NL, vol. 266, No. 24, pp. 5116-5119, Dec. 1, 2008.

Virdi, et al., "On the role of fluorine in BF2<+> implanted silicon", Solid State Electronics Elsevier Science Publishers, Barking, GB, vol. 35, No. 4, pp. 535-540, dated Apr. 1, 1992.

* cited by examiner

*Primary Examiner* — Michelle Mandala
*Assistant Examiner* — Shaka White
(74) *Attorney, Agent, or Firm* — Baker Botts L.L.P.

(57) ABSTRACT

Defects in a semiconductor substrate due to ion implantation are minimized by forming an implant region in the semiconductor substrate and subjecting the semiconductor substrate to a first anneal to recrystallize the semiconductor substrate. The semiconductor substrate is subjected to a second anneal to suppress diffusion of implanted ions in the semiconductor substrate. The first anneal being at a lower temperature and longer duration than the second anneal.

17 Claims, 5 Drawing Sheets

METHOD FOR MINIMIZING DEFECTS IN A SEMICONDUCTOR SUBSTRATE DUE TO ION IMPLANTATION

TECHNICAL FIELD

The present disclosure relates in general to semiconductor fabrication techniques and more particularly to a method for minimizing defects in a semiconductor substrate due to ion implantation.

BACKGROUND

In conventional semiconductor manufacturing processes, ion implantation into a substrate is typically performed through a thermal oxide layer. During ion implantation, oxygen atoms are likely to be driven into the silicon lattice of the substrate. This phenomenon, known in the industry as oxygen "knock on", is responsible for current leakage into the substrate that may degrade operation. Thus, knock-on oxide provides a source for crystalline defects. To offset the effects of knock-on oxide, adequate thermal annealing with its inherent diffusion of impurities is typically performed to contain the defects within the dopant profile.

Ion implantation also introduces substrate crystal damage, in which lattice atoms are knocked out of lattice sites, while at the same time a certain number of the newly-introduced atoms will likewise come to rest in positions outside the lattice positions. Such out-of-position phenomena are termed defects. A vacant lattice site is termed a vacancy defect, while an atom located at a non-lattice site is referred to as an interstitial defect. Another defect is the creation of amorphous silicon which must be annealed to return it to its crystalline state. The restorative method generally employed in the art consists of annealing the substrate, where heat is applied to the lattice to mildly energize the atoms, allowing them to work themselves back into the lattice structure and restoring the ion-implanted substrate to its pre-implant condition.

SUMMARY

From the foregoing, it may be appreciated by those skilled in the art that a need has arisen to reduce defects introduced into a semiconductor substrate caused by ion implantation that would effect the operation of a device formed therein. In accordance with the present disclosure, there is provided a method for minimizing defects in a semiconductor substrate due to ion implantation that substantially eliminates or greatly reduces problems and limitations associated with conventional semiconductor fabrication processes.

According to the present disclosure, a method for minimizing defects in a semiconductor substrate due to ion implantation is presented that includes providing a semiconductor substrate and forming an implant region in the semiconductor substrate. The semiconductor substrate is subjected to a first anneal to recrystallize the semiconductor substrate. The semiconductor substrate is subjected to a second anneal to suppress diffusion of implanted ions. The first anneal is at a lower temperature and longer duration than the second anneal.

The present disclosure provides various technical advantages over devices made by conventional semiconductor fabrication processes. For example, one technical advantage is in the recrystallization of the semiconductor substrate after ion implantation. Another technical advantage is to suppress diffusion of implanted ions in the semiconductor substrate. Some of these technical advantages are shown and described in the following description. Embodiments described herein may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure and the advantages thereof, reference is made to the following description taken in conjunction with the accompanying drawings, wherein like reference numerals represent like parts in which.

DETAILED DESCRIPTION

Figure 1:
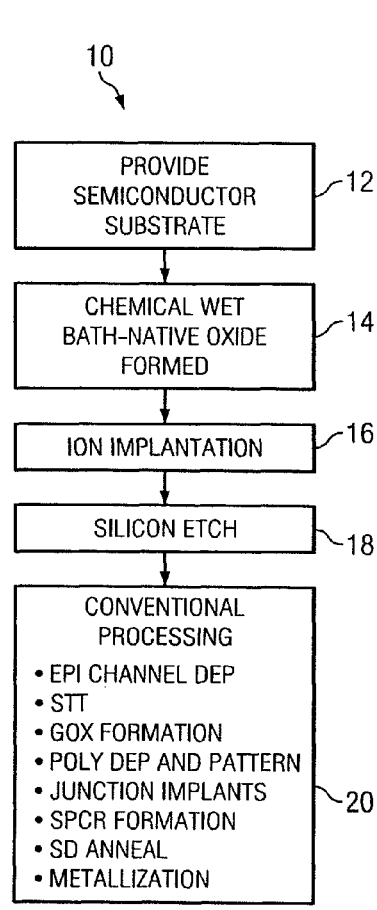
FIG. 1 illustrates a manufacturing process showing steps performed on a semiconductor substrate prior to and after ion implantation.
Figure 2A:
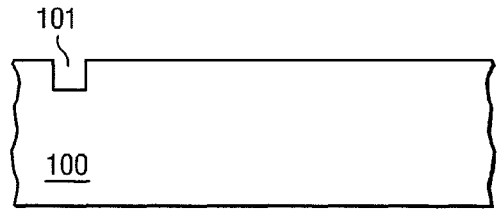
FIGS. 2A-2F illustrate the changes in the device structure as a result of each step of the process of FIG. 1.
Figure 2B:
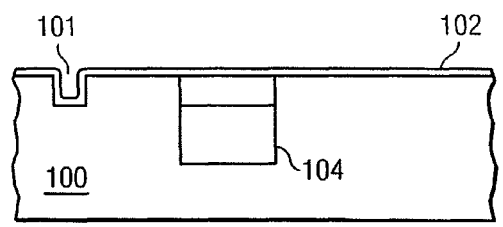
Figure 2C:
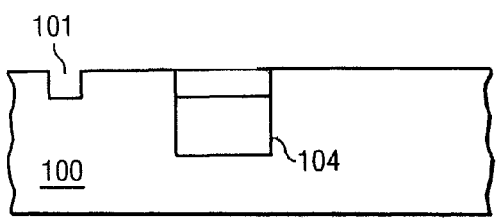
Figure 2D:
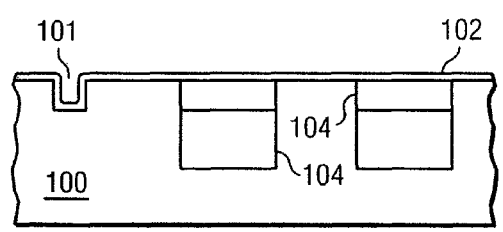
Figure 2F:
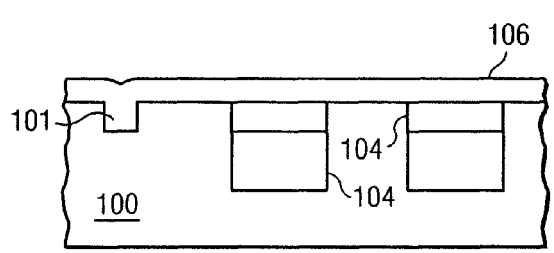
Figure 2E:
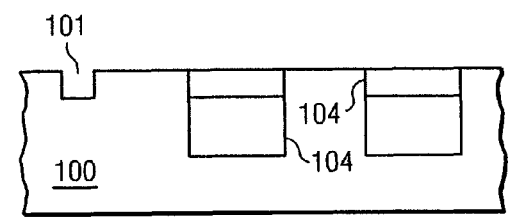

FIG. 1 illustrates manufacturing process 10 in creating a circuit element. Manufacturing process 10 shows steps performed on a semiconductor substrate prior to and after ion implantation. FIGS. 2A-2F illustrate the changes in the device structure as a result of each step of process 10. Process 10 may be part of a 90 nm or less CMOS technology using approximately 300 mm wafers.

Process 10 begins in block 12 by manufacturing or providing a semiconductor substrate 100. A mask alignment mark may be formed in substrate 100. During conventional processing steps, a thermal oxide layer is typically formed on the surface of the substrate for protection. Ion implantation is then performed through this thermal oxide layer, resulting in the knock-on oxide phenomenon. For the present application, a native oxide layer 102 is formed on the surface instead of the thermal oxide layer of conventional processes. Native oxide layer 102 is formed on substrate 100 in block 14 by dipping substrate 100 in a chemical wet bath.

The chemical wet bath may include hydrogen peroxide $H_2O_2$ or nitric acid $HNO_3$. Solutions with two or more compounds may also be used for the chemical wet bath, such as $HCl/H_2O_2/H_2O$. An example concentration for the solution may be 1 part HCl, two parts $H_2O_2$, and 110 parts $H_2O$. The substrate 100 may be dipped in the chemical wet bath for a period sufficient to grow at least a monolayer of native oxide on substrate 100. The time and temperature parameters to perform such growth may be 5 to 20 minutes at a temperature of 25° C. to 70° C. The time and temperature parameters for the chemical wet bath may be adjusted as desired. Prior to the chemical wet bath, substrate 100 may be subjected to hydrofluoric acid HF cleaning and then rinsed.

The result of the chemical wet bath is the growth of a thin layer 102 of native oxide. This native oxide layer 102 may have a thickness of approximately 1 nm and provides protection to the surface of substrate 100. Native oxide provides better properties than thermal oxide to reduce the effects of knock-on oxide occurring as a result of ion implantation.

After the chemical wet bath dip, process 10 continues at block 16 where ion implantation is performed through native oxide layer 102 to create one or more implant regions 104 in substrate 100. Substrate 100 may be subject to the HF clean and rinse and the chemical wet bath dip prior to the separate formation of each implant region 104.

In order to further reduce the effect of knock-on oxide, process 10 continues at block 18 with an anisotropic silicon etch to remove an amount of the surface of substrate 100. The majority of the oxygen atoms driven into the silicon lattice of the substrate by ion implantation are near the surface of substrate 100. Etching a small portion of the surface of substrate 100 will eliminate those oxygen atoms and improve operation of the end device.

The silicon etching may be performed in a chemical wet bath. The solution used in this chemical wet bath may include tetramethylammonium hydroxide TMAH. An example etching process may include a solution of 5% to 25% by weight TMAH in water at a temperature between 70° C. and 90°. Other parameters and other solutions may be used in the etching process as desired to achieve a similar result. For example, a potassium hydroxide KOH solution or an ammonium hydroxide $NH_4OH$ solution may be used instead of TMAH. The silicon etch need only take away about 1 to 5 nm of the surface of substrate 100 as further etching produces insignificant additional benefits in reducing the knock-on phenomenon. An HF clean may be performed prior and/or subsequent to silicon etching to remove any native oxide remaining on the surface of substrate 100.

After silicon etching, process 10 may proceed at block 20 with convention processing steps. These steps may include the formation of an epitaxial layer 106 to establish a channel region for a transistor device and defining the source, drain, and gate regions and contacts of the transistor device. Final annealing and secondary ion mass spectrometry may then performed as desired.

Figure 3A:
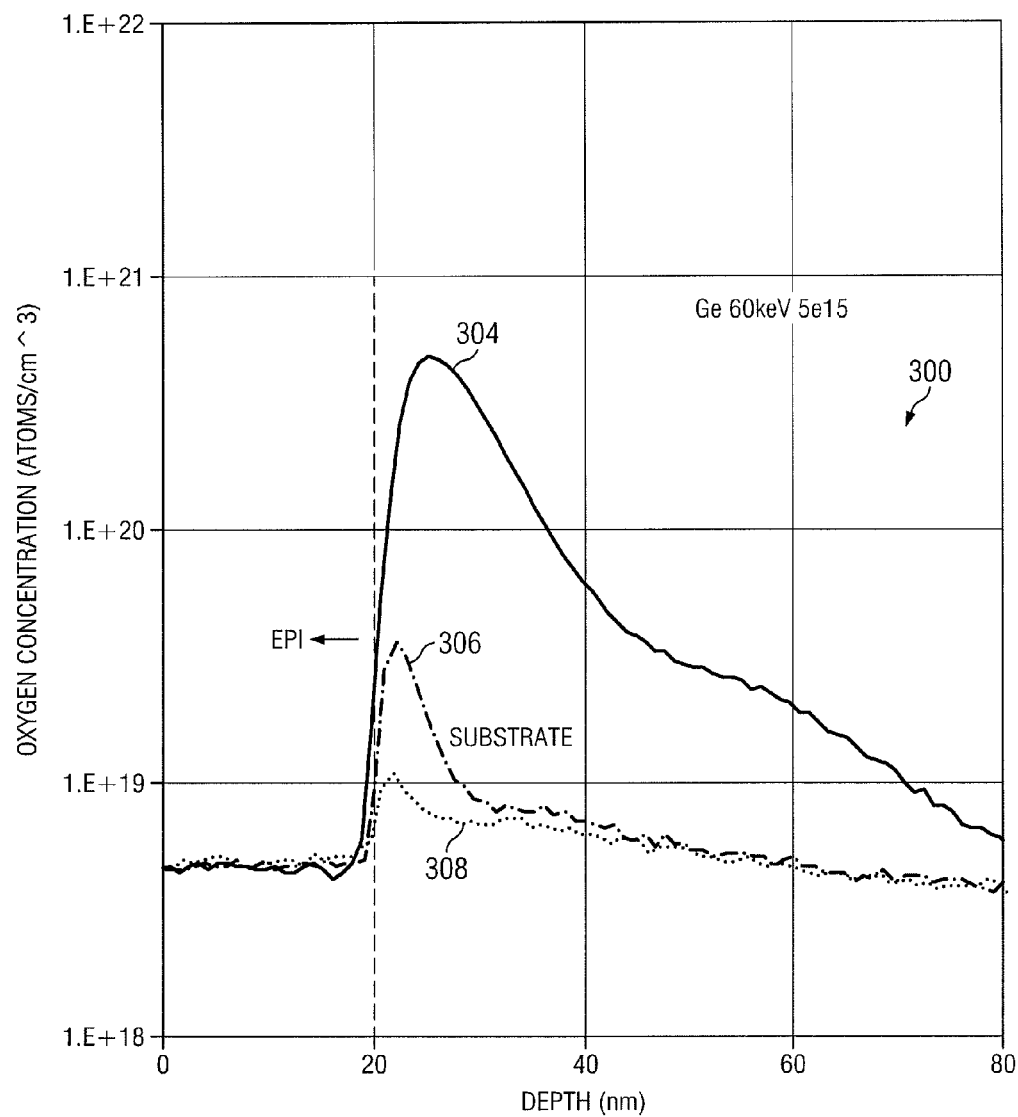
FIGS. 3A and 3B illustrate graphs of the oxygen concentration in a substrate after ion implantation comparing the process of FIG. 1 to conventional processing and variations in the process.
Figure 3B:
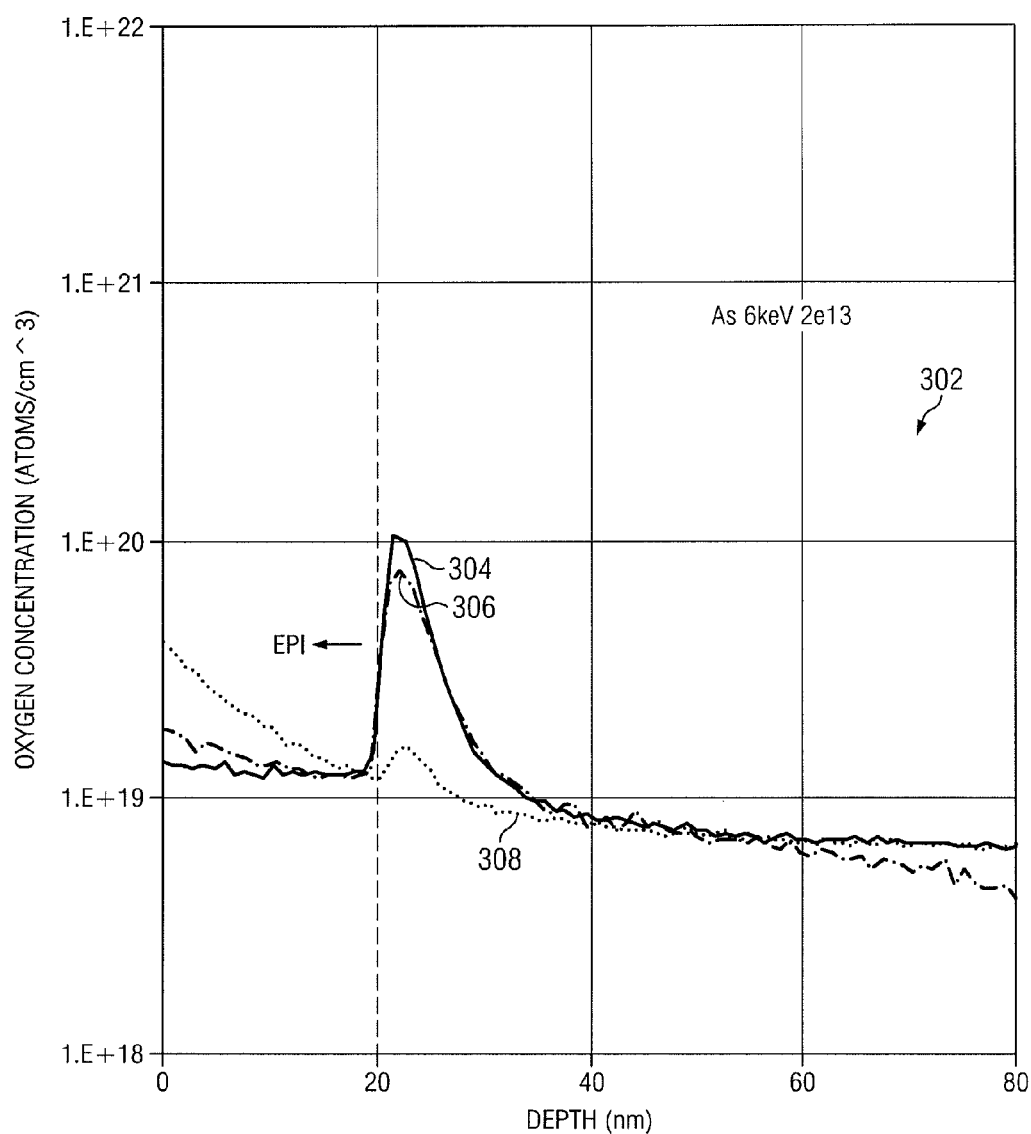

FIGS. 3A and 3B illustrate graphs 300 and 302 of the oxygen concentration in substrate 100 after ion implantation comparing process 10 to conventional processing and variations in process 10. FIG. 3A shows the oxygen concentration graph 300 in substrate 100 for an implant of Germanium at 50 keV and $5e15/cm^2$ concentration, a p-type dopant typical for a NMOS device. FIG. 3B shows the oxygen concentration graph 302 in substrate 100 for an implant of Arsenic at 6 keV and $2e13/cm^2$ concentration, a n-type dopant typical for a PMOS device. In both graphs, lines 304 show the oxygen concentration of substrate 100 for a conventional processing of ion implantation through a thermal oxide layer used as protection on substrate 100. Lines 306 show the oxygen concentration of substrate 100 for process 10 for ion implantation through native oxide layer 102 used as protection on substrate 100 without the subsequent silicon etch. Lines 308 show the oxygen concentration of substrate 100 for process 10 for ion implantation through native oxide layer 102 used as protection on substrate 100 with the subsequent silicon etch. As illustrated in graphs 300 and 302, oxygen concentration in substrate 100 can be reduced by using native oxide layer 102 for protection in place of a conventional thermal oxide layer. Further reduction in oxygen concentration can be achieved by performing a post ion implantation silicon etch.

Figure 4:
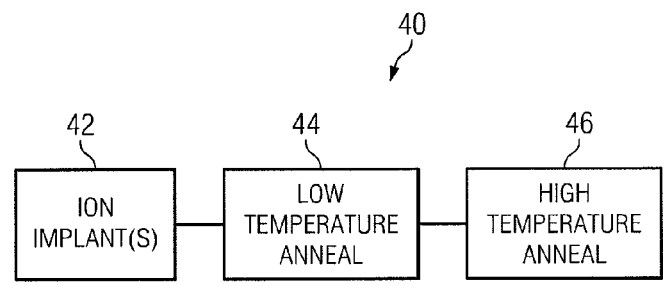
FIG. 4 illustrates an annealing process to minimize defects in a substrate due to ion implantation.

FIG. 4 illustrates a process 400 to minimize defects in substrate 100 due to ion implantation. Process 40 may be performed in block 16 of process 10. Process 40 begins at block 42 with ion implantation. After ion implantation, process 40 continues at block 44 with a low temperature anneal. Low temperature anneal is performed to offset the damage to the substrate caused by ion implantation. Low temperature anneal is performed to recrystallize substrate 100 and eliminate amorphous silicon created during ion implantation.

Figure 5:
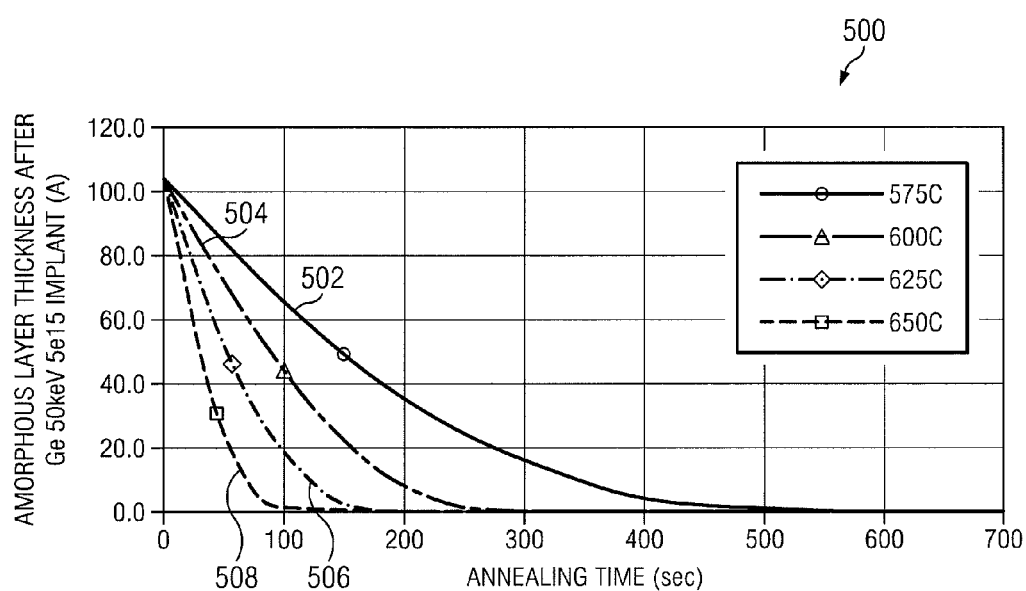
FIG. 5 illustrates a graph showing different temperature and time parameters for the annealing processes.

FIG. 5 illustrates a graph 500 showing different annealing processes for an implant of Germanium at 50 keV and $5e15/cm^2$ concentration. The parameters involved with the low temperature anneal include temperature, time, and ambient environment. The ambient environment may be nitrogen or oxygen. There is a trade-off between temperature and time where a higher temperature results in a lesser amount of annealing time. As shown in graph 500, line 502 represents an anneal process at a temperature of 575° C. that takes about 600 seconds to eliminate a thickness of amorphous silicon created during ion implantation. Line 504 shows that raising the temperature to 600° C. can reduce the anneal time to 150 seconds. Line 506 shows that raising the temperature further to 625° C. reduces the anneal time to less than 150 seconds. Line 508 shows that raising the temperature further to 650° C. reduces the anneal time to much less than 150 seconds.

Returning to FIG. 4, after the low temperature anneal is performed, process 40 continues at block 44 where substrate 100 is subject to a high temperature anneal. High temperature anneal is performed to set implanted impurities at substitution effectively and suppress diffusion of dopant impurities implanted during ion implantation. For example, a p-type dopant for a NMOS device may include germanium, boron, and carbon. The high temperature anneal suppresses the diffusion of boron and carbon in order control the characteristics of implant region 104. An example of a high temperature anneal would be at approximately 1000° C. for a period of 5 seconds or less.

Figure 6A:
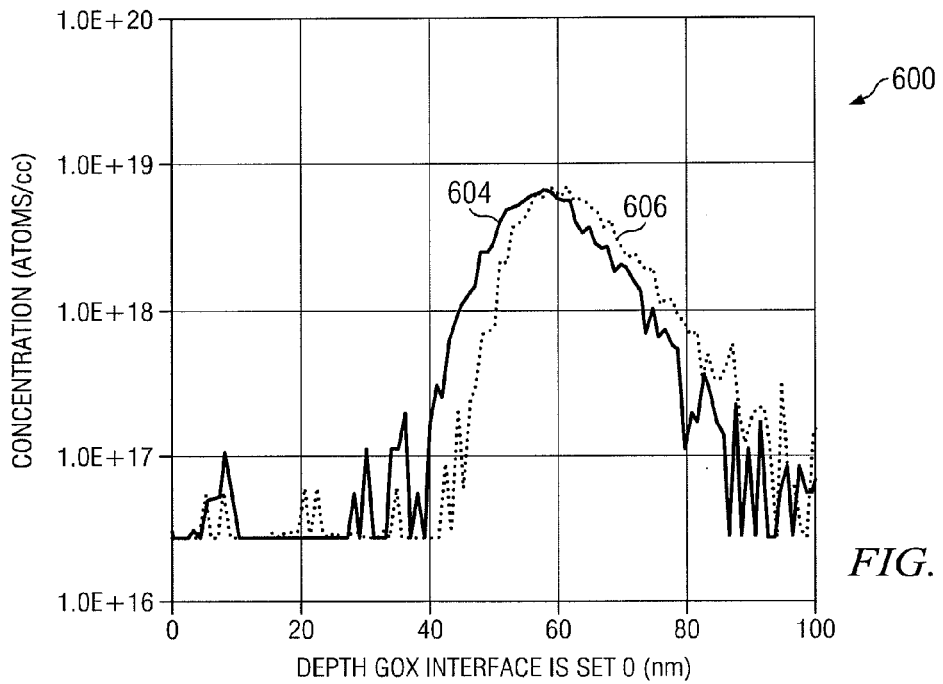
FIGS. 6A and 6B illustrate graphs showing a concentration of boron and carbon atoms respectively resulting from the annealing process.
Figure 6B:
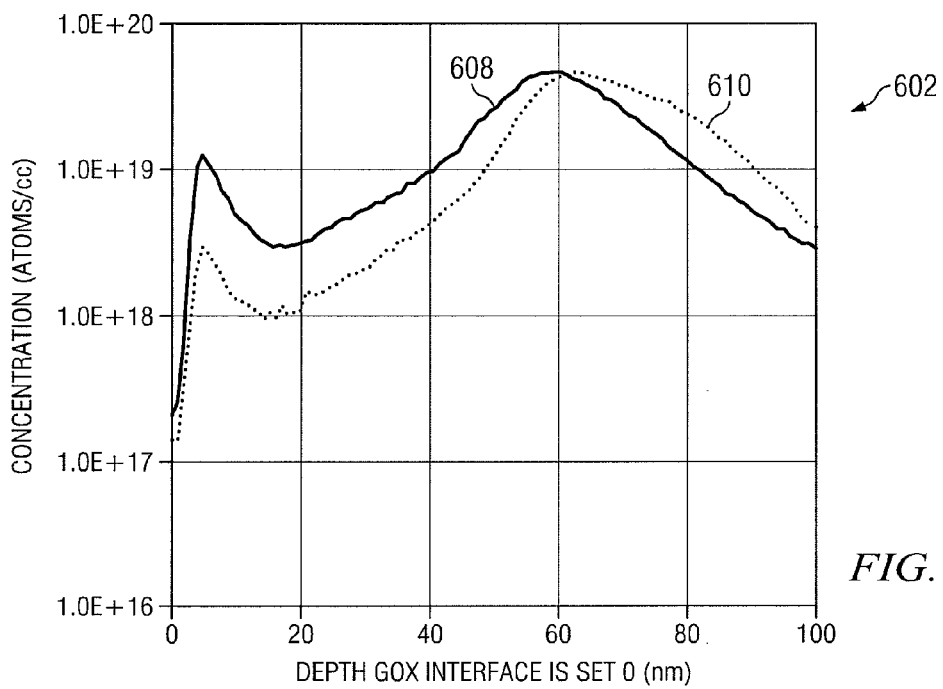

FIGS. 6A and 6B illustrate graphs 600 and 602 showing the concentration of boron and carbon atoms respectively. Graph 600 shows a line 604 representing the concentration of boron atoms after applying a full thermal budget (including shallow trench isolation, gate oxidation, and source/drain formation) with a low temperature anneal only. Graph 600 shows a line 606 representing the concentration of boron atoms after applying a full thermal budget (including shallow trench isolation, gate oxidation, and source/drain formation) with a high temperature anneal. As shown in Graph 600, line 606 associated with the high temperature anneal has a less diffused profile than line 604 without the high temperature anneal. Graph 602 shows a line 608 representing the concentration of carbon atoms after applying a full thermal budget (including shallow trench isolation, gate oxidation, and source/drain formation) with a low temperature anneal only. Graph 602 shows a line 610 representing the concentration of carbon atoms after applying a full thermal budget (including shallow trench isolation, gate oxidation, and source/drain formation) with a high temperature anneal. As shown in Graph 602, line 610 associated with the high temperature anneal has a less diffused profile than line 608 without the high temperature anneal. Similar suppression of other materials can be achieved with the high temperature anneal.

Although the present disclosure has been described in detail with reference to a particular embodiment, it should be understood that various other changes, substitutions, and alterations may be made hereto without departing from the spirit and scope of the appended claims. For example, although the present disclosure includes a description with reference to a specific ordering of processes, other process sequencing may be followed to achieve the end result discussed herein.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for minimizing defects in a semiconductor substrate due to ion implantation, comprising:
   providing a semiconductor substrate;
   forming a first oxide layer on the entire surface of the semiconductor substrate;
   forming a first implant region through the first oxide layer in the semiconductor substrate;
   removing the first oxide layer;
   forming a second oxide layer on the entire surface of the semiconductor substrate and over the first implant region, wherein the first and second oxide layers are native oxide layers;
   forming a second implant region through the second oxide layer in the semiconductor substrate;
   subjecting the semiconductor substrate to a first anneal to recrystallize the semiconductor substrate;
   subjecting the semiconductor substrate to a second anneal to suppress diffusion of implanted ions in the semiconductor substrate, the first anneal being at a lower temperature and longer duration than the second anneal.

2. The method of claim 1, further comprising:
   removing the second oxide layer.

3. The method of claim 2, wherein the first and second oxide layers are removed by performing a hydrofluoric acid clean and rinse.

4. The method of claim 1, further comprising:
   forming a blanket epitaxial layer on the entire surface of the semiconductor substrate and over the first and second implant regions.

5. The method of claim 4, wherein the epitaxial layer is formed following the first and second anneals.

6. The method of claim 1, wherein the first anneal is performed at a temperature of 650° C. for a duration of 150 seconds.

7. The method of claim 6, wherein the second anneal is performed at a temperature of approximately 1000° C. for a duration of 5 seconds or less.

8. The method of claim 1, wherein the first anneal is performed at a temperature between 575° C. and 650° C. for a duration between 600 and 150 seconds respectively.

9. The method of claim 8, wherein the second anneal is performed at a temperature of approximately 1000° C. for a duration of 5 seconds or less.

10. The method of claim 1, wherein the second anneal is performed at a temperature of approximately 1000° C. for a duration of 5 seconds or less.

11. The method of claim 1, wherein the semiconductor substrate is a 300 mm wafer and the steps are performed for a 90 nm or less CMOS technology process.

12. The method of claim 1, wherein the first and second oxide layers are formed by dipping the semiconductor substrate in a chemical wet bath.

13. The method of claim 12, wherein the chemical wet bath includes hydrogen peroxide or nitric acid.

14. The method of claim 12, wherein the chemical wet bath includes a solution of hydrochloric acid, hydrogen peroxide, and water.

15. The method of claim 14, wherein the solution is made up of 1 part hydrochloric acid, 2 parts hydrogen peroxide, and 110 parts water.

16. The method of claim 12, wherein the semiconductor substrate is dipped in the chemical wet bath for a period of 5 to 20 minutes at a temperature of 25° C. to 70° C.

17. The method of claim 1, further comprising:
    performing a hydrofluoric acid clean and rinse prior to forming the first oxide layer.

* * * * *

UNITED STATES PATENT AND TRADEMARK OFFICE
CERTIFICATE OF CORRECTION

PATENT NO. : 8,377,807 B2  Page 1 of 1
APPLICATION NO. : 12/895657
DATED : February 19, 2013
INVENTOR(S) : Lucian Shifren et al.

It is certified that error appears in the above-identified patent and that said Letters Patent is hereby corrected as shown below:

Title Page, item (73) Assignee: delete "Suvolta, Inc., Los Gatos, CA (US)" and insert --SuVolta, Inc., Los Gatos, CA (US)--.

Signed and Sealed this
Twenty-eighth Day of May, 2013

Teresa Stanek Rea
*Acting Director of the United States Patent and Trademark Office*